United States Patent
Mann et al.

(10) Patent No.: US 10,649,021 B2
(45) Date of Patent: May 12, 2020

(54) POWER TRANSISTOR, DRIVER AND OUTPUT STAGE INCLUDING AN ACTIVE REGION, A METALLIZATION LEVEL, AND A FURTHER METALLIZATION LEVEL

(71) Applicant: Robert Bosch GmbH, Stuttgart (DE)

(72) Inventors: Alexander Mann, Steinenbronn (DE); Daniel Schneider, Eningen Unter Achalm (DE); Henning Lohmeyer, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/088,099

(22) PCT Filed: Mar. 1, 2017

(86) PCT No.: PCT/EP2017/054788
§ 371 (c)(1),
(2) Date: Sep. 25, 2018

(87) PCT Pub. No.: WO2017/186382
PCT Pub. Date: Nov. 2, 2017

(65) Prior Publication Data
US 2019/0086467 A1    Mar. 21, 2019

(30) Foreign Application Priority Data
Apr. 29, 2016 (DE) .......... 10 2016 207 349

(51) Int. Cl.
*G01R 31/26* (2020.01)
*H01L 21/66* (2006.01)
(Continued)

(52) U.S. Cl.
CPC ......... *G01R 31/2608* (2013.01); *G01R 31/40* (2013.01); *H01L 22/34* (2013.01);
(Continued)

(58) Field of Classification Search
CPC .......................... G01R 31/2608; H01L 23/528
See application file for complete search history.

(56) References Cited

U.S. PATENT DOCUMENTS

| | | |
|---|---|---|
| 2012/0212245 A1 | 8/2012 | Pinto et al. |
| 2013/0285219 A1* | 10/2013 | Segan ............ H01L 23/5223 257/666 |
| 2016/0118890 A1 | 4/2016 | Yamada et al. |

OTHER PUBLICATIONS

International Search Report for PCT/EP2017/054788, dated Jun. 2, 2017.

(Continued)

*Primary Examiner* — Quoc D Hoang
(74) *Attorney, Agent, or Firm* — Norton Rose Fulbright US LLP; Gerard Messina

(57) ABSTRACT

A power transistor, a driver and an output stage. The power transistor includes an active region and a metallization level located above the active region for power distribution and for detecting an imminent metallization error induced by stress (RPP stress) caused by repeated power pulses. The power transistor also includes a further metallization level, which is located above the metallization level and in which galvanically isolated metal elements extend mutually parallel in a direction of extent, of which one pair is used for energizing the power transistor. It is a characteristic of the power transistor that at least one cut-out is formed above the active region in the further metallization level. The cut-out has the effect of decreasing heat dissipation. The power transistor is thereby heated more intensely in the localized region, so that large temperature gradients occur in the transition region defined by the edges of the metal elements.

10 Claims, 8 Drawing Sheets

(51) Int. Cl.
  *H01L 29/417* (2006.01)
  *G01R 31/40* (2020.01)
  *H01L 23/528* (2006.01)
  *H03K 17/14* (2006.01)
(52) U.S. Cl.
  CPC .... *H01L 23/5286* (2013.01); *H01L 29/41758* (2013.01); *H03K 17/145* (2013.01); *H03K 2217/0072* (2013.01)

(56) References Cited

OTHER PUBLICATIONS

Ritter Matthias et al., "A proposal for early warning indicators to detect impending metallization failure of DMOS transistors in cyclic operation", 2014 International Conference on Microelectronic Test Structures (ICMTS), IEEE, Mar. 23, 2015, pp. 18-22, XP032776361.

Pham Gimi et al., "Influence of metallization layout on aging detector lifetime under cyclic thermo-mechanical stress", 2016 IEEE International Reliability Physics Symposium (IRPS), IEEE, Apr. 17, 2016, pp. 5B-5-1-pp. 5B-5-2, XP032969763.

Pfost Martin et al., "Influence of the On-Chip Metallization on Self-Heating in Integrated Power Technologies", IEEE Transactions on Semiconductor Manufacturing, IEEE Service Center, Piscataway, NJ, US, vol. 27, No. 2, May 1, 2014, pp. 169-177, XP011547051.

Simon Dan et al., "Experimental Reliability Improvement of Power Devices Operated Under Fast Thermal Cycling", IEEE Electron Device Letters, IEEE Service Center, New York, NY, US, vol. 36, No. 7, Jul. 1, 2015, pp. 696-698, XP011585545.

Asakura H et al., "An Advanced Defect-Monitoring Test Structure for Electrical Screening and Defect Localization", IEEE Transactions on Semiconductor Manufacturing, IEEE Service Center, Piscataway, NJ, US, vol. 17, No. 2, May 10, 2004, pp. 104-110, XP011112474.

Werner Kanert., "Reliability challenges for power devices under active cycling", Reliability Physics Symposium, 2009 IEEE International, IEEE, Piscataway, NJ, USA, Apr. 26, 2009, pp. 409-415, XP031496442.

Tobias Smorodin et al., "A Temperature-Gradient Induced Failure Mechanism in Metallization Under Fast Thermal Cycling," IEEE Transactions on Device and Material Reliability, vol. 8, No. 3, Sep. 2008.

* cited by examiner

POWER TRANSISTOR, DRIVER AND OUTPUT STAGE INCLUDING AN ACTIVE REGION, A METALLIZATION LEVEL, AND A FURTHER METALLIZATION LEVEL

FIELD

The present invention relates to a power transistor, a driver and an output stage.

BACKGROUND INFORMATION

Power transistors, for example, field-effect transistors, bipolar transistors, respectively IGBTs (insulated gate bipolar transistors) are electronic semiconductor components for switching or controlling high voltages, currents, respectively output power. They act as electrical resistance, which, with the aid of a control signal, can modify the current of a useful signal by several orders of magnitude. For field-effect transistors, the control signal thereby corresponds to a voltage at the gate, whereas bipolar transistors are controlled by a current at the base.

The present invention is explained in the following with reference to an FET power transistor (FE stands for field effect), which likewise applies to bipolar transistors, respectively IGBTs (insulated gate bipolar transistors), a combination of bipolar transistor and controlling field-effect transistor.

FET power transistors are used, for example, as integrated drivers for the automotive sector, for instance, as drivers for brake valves and injectors. Other applications in the automotive sector include drivers for transmitters, for example, for a parking assist system and for the pulse width-modulated energization of PTC resistors—configured lamp drivers. However, FET power transistors are also used outside of the automotive sector.

An example of an application of FET power transistors in the automotive sector is the use as a low-side switch, thus as a switch on the ground side, for controlling cyclically inductive loads, as occur, for example, in valve driver applications for application-specific integrated circuits (ASIC: application-specific integrated circuit), respectively for a vehicle dynamics control (ESP for an electronic stability program) or an anti-lock braking system (ABS). There are typically switching pulses, which are also referred to as clamped switching of an inductive load (CIS: clamped inductive switching) or also as repeated power pulses (RPP: repetitive power pulsing). Comparable events involving repeated pulse loading can also occur in the case of transistors for controlling smaller loads, respectively ohmic loads when fault conditions occur and must be controlled.

As a function of the operating point thereof, i.e., of the level of the drain-source voltage and the measure of the gate-source voltage in comparison to the threshold voltage, repeated power pulses lead in FET power transistors to a conversion of power loss in the component and thus, if indicated, to a significant self-heating. Depending on the type of event and the load profile, the resulting rapid thermal cycles can constitute a significant thermomechanical loading of the actual metallization of the components.

FIG. 1 shows a specific embodiment of a low-side switch having an FET power transistor in accordance with the related art. The schematic curves of drain voltage 20, drain current 30 and temperature 40 in accordance with the related art during a switching pulse of the low-side switch are plotted therefor in FIG. 2.

The low-side switch thereby has an FET power transistor 300 and a gate drive circuit in the form of a Zener diode chain 100 between drain 320 and gate 310 of FET power transistor 300, which allow a controlled reduction of the energy stored in the load in the case that inductive load 400 is disconnected, so that the induced voltage remains within the component specifications.

In the variant of output stage 10 shown in FIG. 1, a high power pulse is obtained during the switching-off process as follows: If the induced voltage exceeds the breakdown voltage of Zener diode chain 100, the result is that gate 320 of FET transistor 300 is charged, whereby FET transistor 300 is driven above the threshold voltage thereof to exactly the point where it can discharge the induced current, so that the energy stored in inductive load 400 is reduced. Due to the high drain voltage, this operating state briefly results in a high power loss, thereby leading to a significant self-heating of the output stage. Depending on the size of the output stage and the pulse length, this heating may lead to a temperature distribution that is considerably inhomogeneous laterally, as well as vertically. Due to the greatly differing thermal expansion coefficients of the materials for circuit traces and dielectrics (for example, aluminum-copper alloy (AlCu) or copper (Cu) as circuit trace and silicon dioxide ($SiO_2$) as an interlayer dielectric) used within the output stage metallization, the pulsed operation leads to additional thermomechanical stress. In this way, an increasing loading of the metallization structure over the lifetime of the product can occur. In the extreme case, cumulative plastic deformation of the circuit circuit traces leads to severe mechanical stress in the interlayer dielectric (ILD for: interlayer dielectric) and finally to breakage of the same. Due to plastic deformation, metal from the circuit circuit traces can subsequently penetrate the resulting crack and result in short-circuiting of the drain-source metallization, signifying component failure (see FIG. 3). In this embodiment, the described error mechanism is also referred to as temperature induced plastic metal deformation (in the following: TPMD).

To prevent failures caused by TPMD, it is necessary to limit the occurring maximum temperature and the resulting temperature gradient in the component and the thermomechanical stress correlating therewith. This is accomplished by an optimal geometric design of the FET transistor with regard to the expected load profile.

In "A Temperature-Gradient Induced Failure Mechanism in Metallization Under Fast Thermal Cycling," IEEE Transactions on Device and Material Reliability, vol. 8, no. 3, September 2008, Tobias Smorodin et al. describe that selective provocation endurance tests lead to circularly distributed failure locations within the output stages. The failure locations are thereby correlated with the location of the maximum temperature gradient.

In "A Proposal for Early Warning Indicators to Detect Impending Metallization Failure of DMOS Transistors in Cyclic Operation," IEEE Proc. ICMTS (Proceedings of the International Conference on Microelectronic Test Structures), March 2015, Mathias Ritter et al. discuss introducing a potential-free metal meander structure having a supercritical design into the metallization system of the FET transistor. It is composed of the identical materials and undergoes the same thermomechanical stress as the remaining metallization system. Using the meander structure, the leakage current can be detected with regard to the drain, respectively source and resistance. Both quantities are influenced by the RPP stress and can be used to draw conclusions about the state of aging of the FET transistor.

SUMMARY

The present invention provides a power transistor.

An example power transistor in accordance with the present invention includes an active region and a metallization level located above the active region for power distribution and for detecting an imminent metallization error induced by stress (RPP stress) caused by repeated power pulses. The power transistor also includes a further metallization level, which is located above the metallization level and in which galvanically isolated metal elements extend mutually parallel in a direction of extent, of which one pair is used for energizing the power transistor. It is a characteristic of the power transistor that at least one cut-out is formed above the active region in the further metallization level.

The cut-out effects an altered thermal connection of the further metallization level to the active region of the transistor. Typically, the power transistor will heat more intensely in this region, so that in the transition region defined by the edges of the cut-out, temperature gradients occur that are greater than in the case of power transistors without any cut-out.

This makes an improved design of the output stage possible in the context of unchanged functional reliability of the output stage, i.e., generally less silicon area consumption, in cooperation with a detection structure in the metallization level.

The transistor according to the present invention only requires a detector structure that uses significantly less than 10% of the surface area over the active region. This merely slightly reduces the contact surface area for the drain and source regions (respectively, collector and emitter regions), and the conductor cross section of the corresponding metal structures is not significantly affected, so that the electrical connection of the transistor is hardly affected, and the forward resistance is only minimally degraded.

In a preferred embodiment, the cut-out, as such, or except for at least one stepped feature that extends into the cut-out, is oval, circular, rectangular, rhombic or octagonal.

These are readily manufacturable embodiments.

The two metal elements of the pair may extend mutually parallel in a direction of extent, and the metallization level may include circuit circuit traces of a useful metal for power distribution extending orthogonally to the direction of extent. A detector circuit circuit trace pair for detecting an imminent metallization error induced by RPP stress may thereby be configured between two circuit circuit traces each. An intermediate layer dielectric may be configured between the circuit circuit traces and the detector circuit circuit traces.

Namely, the detector circuit circuit trace pair may then be configured underneath the stepped feature, resulting in an especially effective detection of the metallization error. Or at least one detector circuit circuit trace of the detector circuit circuit trace pair may feature a projection, so that a separation of the detector circuit circuit trace pair is locally reduced, resulting in an especially effective detection of the metallization error.

An edge of the projection may be configured underneath an edge of the cut-out, once again making it possible to enhance the detection.

The intermediate layer dielectric may have a narrower form between the detection circuit traces than between the circuit traces, so that stress caused by repeated power pulses is more likely to cause damage between the detection circuit traces than between the conductive circuit traces.

Thus, for example, when a crack occurs in the intermediate layer dielectric between two detection circuit traces, an increased leakage current is measurable, and a critical service life point in time prior to damage to the current-carrying metallization structure is consequently ascertainable.

The metal elements may include copper. The further metallization level may include an aluminum copper connection. These are suitable metals for the metallization levels.

The present invention also provides an example driver having a power transistor in accordance with the present invention, and an output stage having a driver in accordance with the present invention.

In the case of vehicle components, in particular, to enhance the component reliability, it is advantageous to use early-warning structures to reduce or completely avoid surprising failures.

Advantageous further refinements of the present invention are described herein.

BRIEF DESCRIPTION OF THE DRAWINGS

Exemplary embodiments of the present invention are described in greater detail below on the basis of the figures.

DETAILED DESCRIPTION OF EXAMPLE EMBODIMENTS

Figure 1:
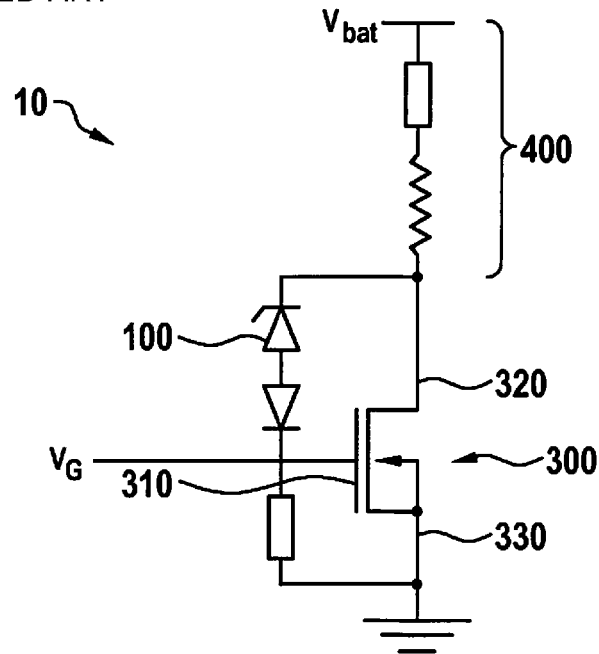
FIG. 1 shows the operating principle of a low-side switch in accordance with the related art.

FIG. 1 illustrates the operating principle of a low-side switch 10 in accordance with the related art. An FET transistor 300 drives an inductive load 400. A Zener diode chain 100 between drain 320 and gate 310 of FET transistor 300 thereby protects against critical induced voltages.

Figure 2:
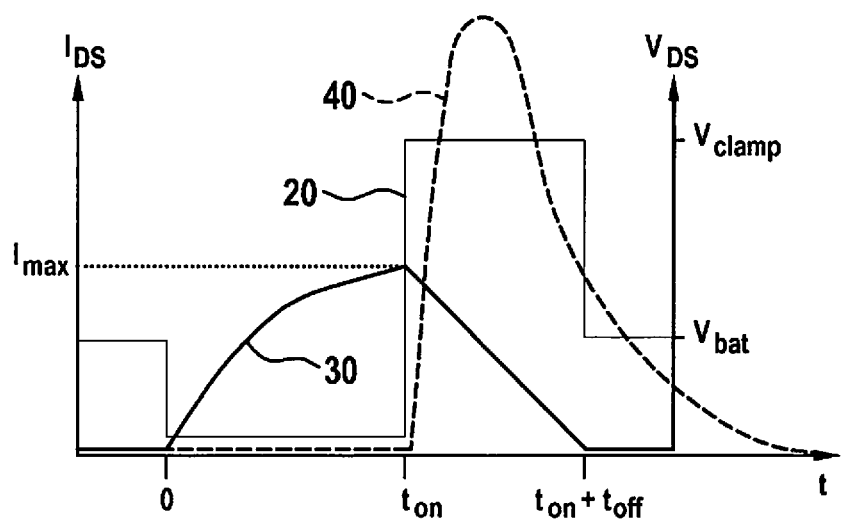
FIG. 2 schematically shows a characteristic of a drain voltage and drain current on an FET transistor for the clamped switching of an inductive load according to the related art when used as a low-side switch.

FIG. 2 schematically shows a characteristic of drain voltage 20 and drain current 30 on an FET transistor according to the related art during a switching-on and switching-off process. The dashed line curve describes a resulting temperature profile 40 within the component.

Figure 3:
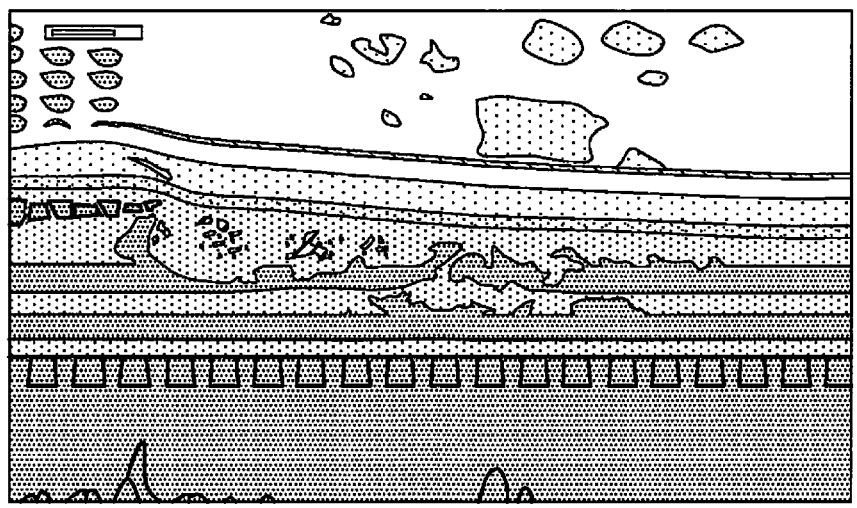
FIG. 3 shows a sectional view through an FET power transistor according to the related art including a fused on metallization system.

FIG. 3 shows a sectional view through an FET power transistor 300 according to the related art including a fused on metallization system. The section was produced using a focused ion beam. The figure shows completely intact, active regions of the output stage transistor, whereas the metallization system was melted by the occurrence of a short circuit caused by TPMD. Accordingly, under these application conditions, this error mechanism is significantly responsible for the service life of the FET transistor.

Figure 4:
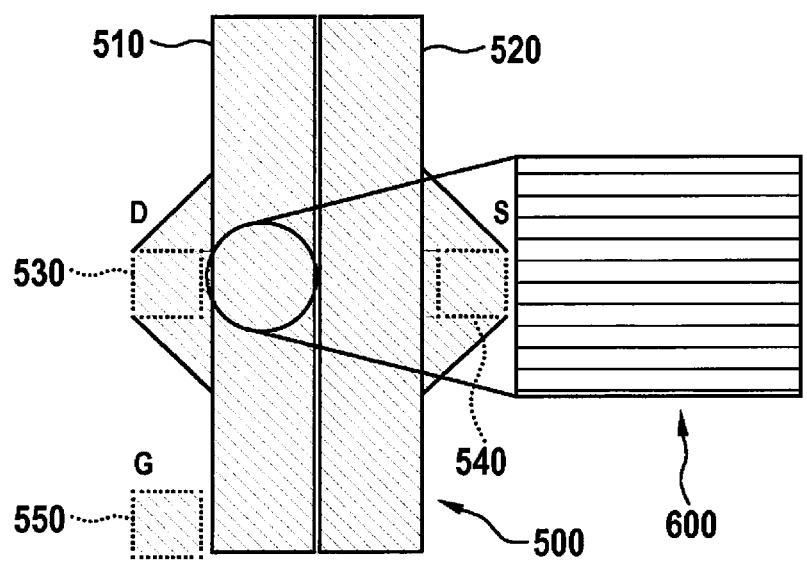
FIG. 4 shows an exemplary, schematic view of a metallization system according to the related art.

On the right in FIG. 4, a formation of a lower metallization level 600 of an FET power transistor according to the related art for distributing power is shown schematically and exemplarily as a finger of an aluminum-copper alloy. This is a detail view of further, upper metallization level 500 of an FET transistor according to the related art that is shown schematically and exemplarily on the left and has metal elements 510, 520 for energization purposes, which, in what is generally referred to as the "plated" layout, are formed as mutually galvanically isolated and constantly mutually separated, parallel extending plates, respectively strips. A plate 510 is used for energizing the drain via a drain terminal 530, and the other plate 520 for energizing the source via a source terminal 540. Other plates may be provided.

By selectively locally adapting the metallization system, the present invention enhances the lateral temperature distribution and thus the stress distribution and, together with detection circuit traces, forms an early warning structure for back end degradation under RPP stress. The potential failure location caused by TPM is substantially localized by adaptation of the metallization system, so that, in comparison to the power-distributing circuit traces in the metallization system, narrow metal fingers suffice as local detection circuit traces to detect a critical advance in the degradation of the FET transistor. The lateral surface area required by the detection circuit traces is so small here that the electrical connection of the transistor is hardly affected. The associated enhanced controllability of the unavoidable RPP degradation may subsequently be used to design FET output stages to be surface area-optimized in the context of varying specification requirements. A control logic may be used to detect a well advanced degradation condition of the FET transistor and begin an intercept measure, respectively early warning routine. This protects against a sudden failure.

By selectively adapting the metallization layout of the FET transistor, the error mechanism is spatially influenced because of the modified local lateral temperature distribution and associated stress distribution. A site of maximum stress is thereby localized.

One possible implementation variant relates to the case where the power-carrying upper metallization layer is designed in the "plated" layout, thus as plates that extend in a direction of extent, and the lower power-distributing metallization level in the "finger" layout, thus as narrow fingers that extend orthogonally to the plates.

Figure 5:
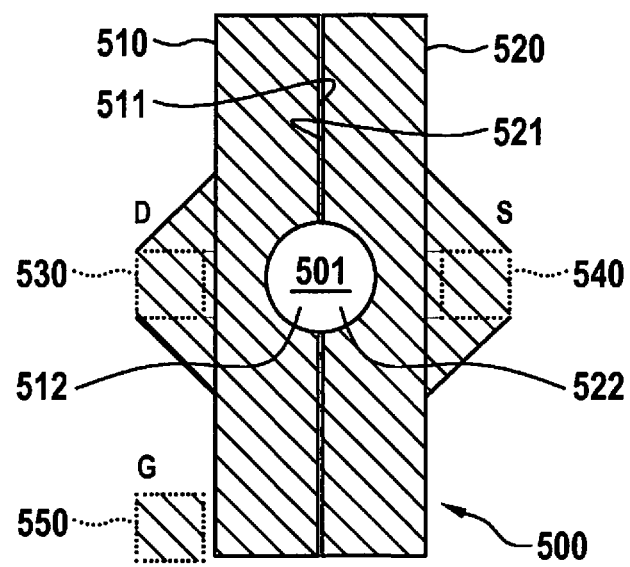
FIG. 5 is a plan view of an upper metallization level of an FET power transistor in accordance with a first exemplary specific embodiment of the present invention.
Figure 6:
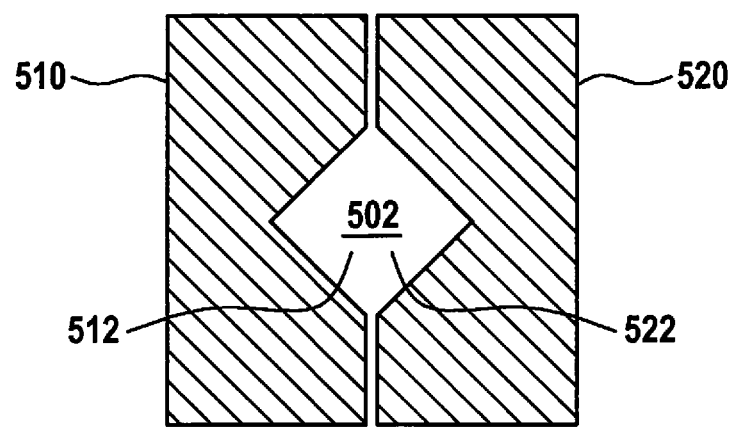
FIG. 6 is a plan view of an upper metallization level of an FET power transistor in accordance with a second exemplary specific embodiment of the present invention.
Figure 7:
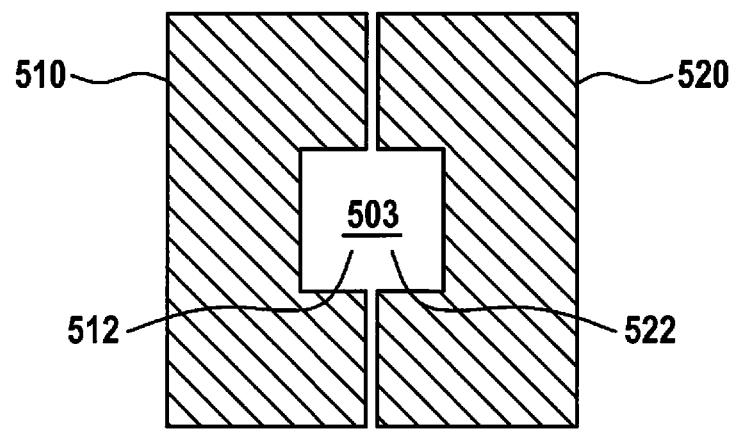
FIG. 7 is a plan view of an upper metallization level of an FET power transistor in accordance with a third exemplary specific embodiment of the present invention.

FIGS. 5, 6 and 7 show plan views of an FET power transistor having various exemplary specific embodiments of the present invention in accordance with this implementation variant. At a deeper metallization level, detection circuit traces extend orthogonally to a direction of extent of metal strips 510, 520 to energize the source and drain of the FET transistor via a source terminal 530 and a drain terminal 540 in another, upper metallization level 500.

In all of the illustrated exemplary specific embodiments of this implementation variant, metal strips 510, 520 outside of an active region of the FET power transistor located between source terminal 540 and a drain terminal 530 have a constant mutual separation. A gate terminal 550 is also provided.

In the exemplary embodiments of FIG. 5 through 9, metal strips 510, 520 each have a cut-out 512, 522 that is disposed above the active region and is located at an edge 511, 521 that faces the respective other metal strip 510, 520. Cut-outs 512, 522 are mirror-symmetric in all of the illustrated exemplary embodiments of this implementation variant. In all of the illustrated exemplary embodiments of this implementation variant, cut-outs 512, 522 are configured in such a way that metal strip-free region 501, 502, 503, 504 of the further metallization level formed by cut-outs 512, 522 is centrally located above the active region.

In the first exemplary specific embodiment of the present invention shown in FIG. 5, cut-outs 511, 521 are each semicircular and together form a complete circle 501.

In the second exemplary specific embodiment of the present invention shown in FIG. 6, cut-outs 511, 521 are each triangular and together form a rhombus 502.

In the third exemplary specific embodiment of the present invention shown in FIG. 7, cut-outs 512, 522 are each rectangular and together form a square 503.

Figure 8:
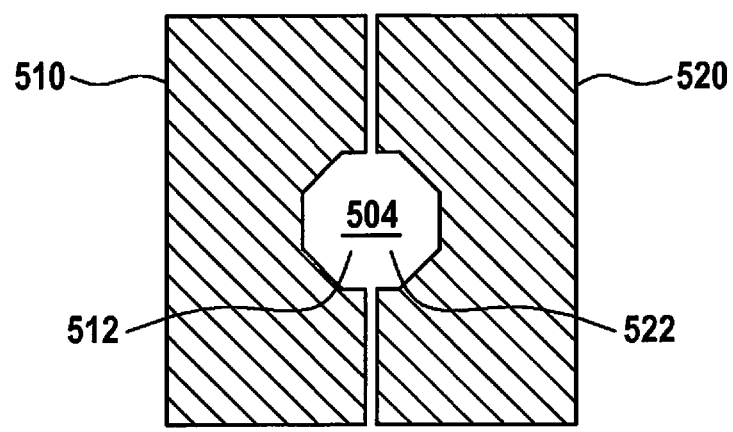
FIG. 8 is a plan view of an upper metallization level of an FET power transistor in accordance with a fourth exemplary specific embodiment of the present invention.

In the fourth exemplary specific embodiment of the present invention shown in FIG. 8, cut-outs 512, 522 together form an octagon 504.

Figure 13:
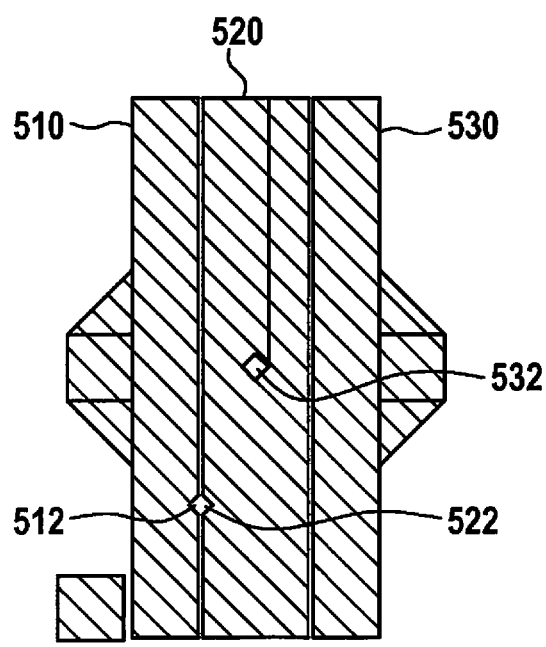
FIG. 13 is a plan view of an upper metallization level of an FET power transistor in accordance with a fifth exemplary specific embodiment of the present invention.

In the fifth exemplary specific embodiment of the present invention shown in FIG. 13, cut-outs 512, 522 are not centrally located above the active region. A cut-out 532 is also formed within that plate 520 which is used for energizing the source of the transistor. Cut-out 532 may also be the only cut-out. Additional metal element 560 also shown in this exemplary embodiment is optional and is used to illustrate that the number of metal elements above the active region is not limited to two.

Figure 14:
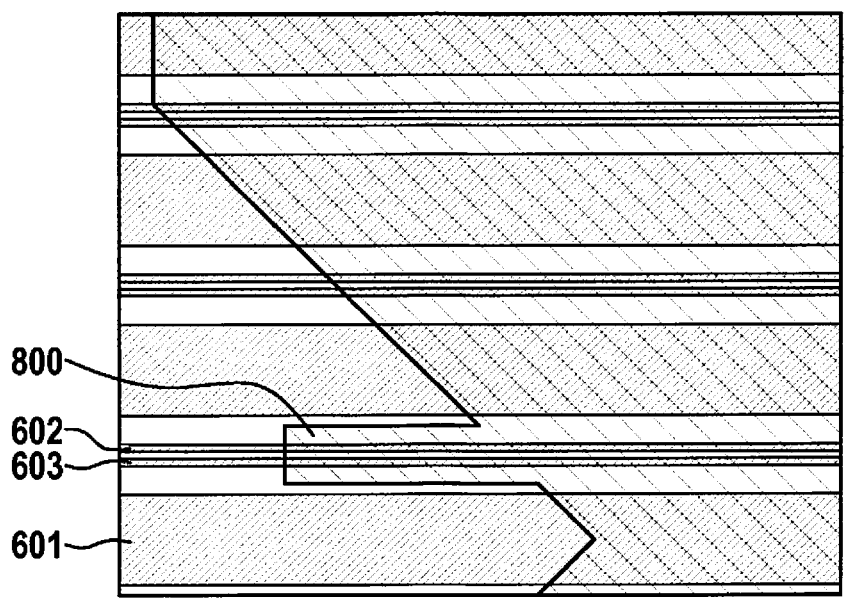
FIG. 14 is an exemplary stepped feature, as may be used in the present invention.

Independently of the basic form of the particular cut-out and the configuration thereof on the edge of or within a metal plate, one or a plurality of stepped features may project into the cut-out orthogonally to the direction of extent of the plate, so that, apart from the stepped feature or stepped features, the particular cut-out has the particular basic form. This is shown exemplarily in FIG. 14. At the tip thereof, stepped feature 800 is connected via an individual contact to subjacent detection circuit trace 602, 603. The resulting minimal contact chain makes it possible for the contact resistance to be monitored and, in the case of advancing thermomechanical stress, is able to detect a separation of the upper metallization level from the contact, with the aid of a resistance measurement. Besides detecting leakage currents caused by occurring cracks in the inter-metal dielectric, this enhances the reliability of detecting the aging of the power transistor.

Figure 15:
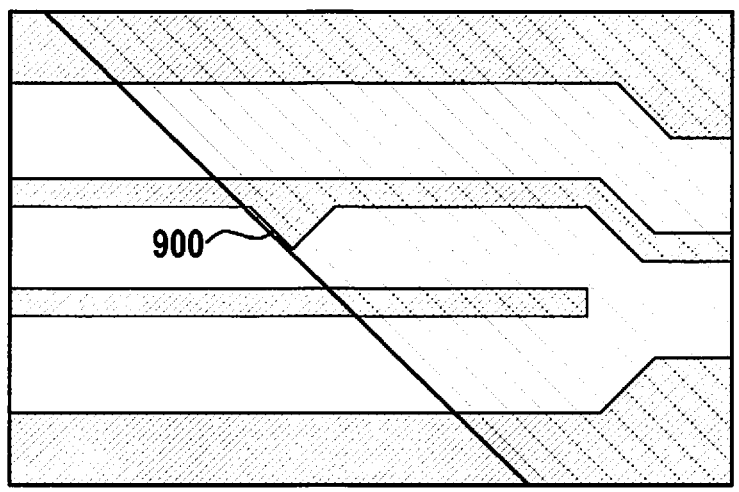
FIG. 15 is an exemplary notch in the interlayer dielectric, as may be used in the present invention.

FIG. 15 shows exemplarily a further embodiment that may be combined with all previous exemplary embodiments. In this embodiment, at least one of detector circuit traces 602, 603 has a projection 900, so that a mutual separation of detector circuit trace pair 602, 603 is locally reduced. The projection is advantageously located in the region of the edge of the cut-out. In FIG. 15, projection 900 is configured underneath the metal element having the cut-out in such a way that an edge of projection 900 coincides with an edge of the cut-out. However, this is only one option of the configuration. In other exemplary embodiments, the projection is completely or partially configured underneath the cut-out. For example, the projection may also be completely configured underneath the cut-out in such a way that an edge of the projection coincides with an edge of the cut-out.

Thus, the topmost power-carrying metallization above the active region is modified in a way that results in the temperature distribution being locally influenced. The cut-outs may be produced, for example, by cutting out metal of the metal strips on a corresponding surface.

Locally enlarging the separation of the metal elements over a limited area of the active region is crucial for the inventive effect. The result is a locally increased proportion of a thermally poorly conductive interlayer dielectric and thus a formation of a thermal bubble.

The surface area is thereby to be expediently selected as a function of the size of the output stage and of the entire lateral temperature distribution thereof, whereas the shape may be flexibly optimized. Besides rhombi, squares, circles or octagons, other cut-out shapes may also be implemented. In some exemplary specific embodiments, the cut-outs are not mirror symmetrical, and/or only one of the plates has a cut-out.

The influence of this modification on the temperature distribution within the metallization system of the output stage is reproducible with the aid of an electro-thermal simulator. To modify the power-carrying metallization by cutting out a rhombus, simulated thermal profile 700 of an FET transistor is shown in a plan view in FIG. 9 following a typical power pulse under accelerated boundary conditions.

Figure 9:
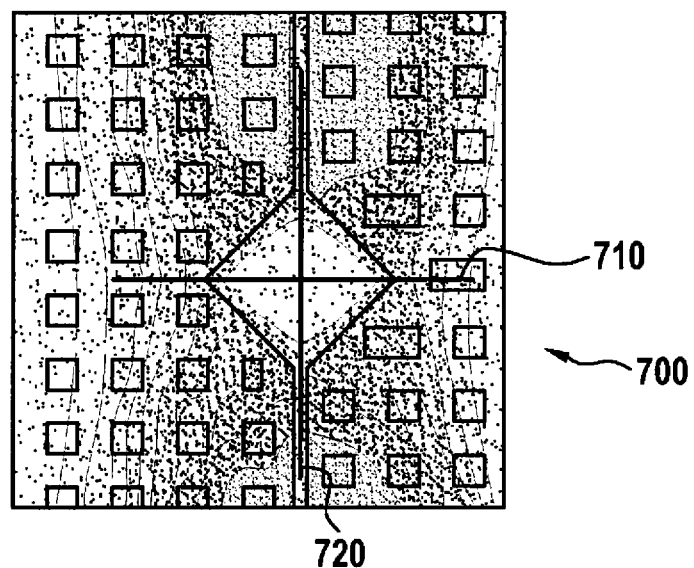
FIG. 9 is an electrothermal simulation of a thermal profile of an FET power transistor in a plan view.
Figure 10:
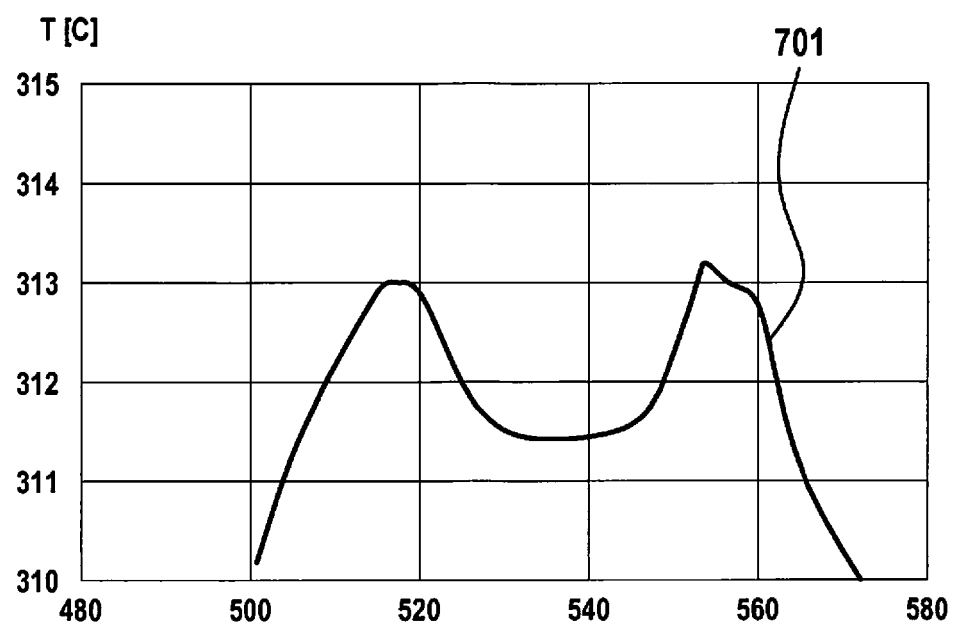
FIG. 10 is the thermal profile in a first sectional plane.
Figure 11:
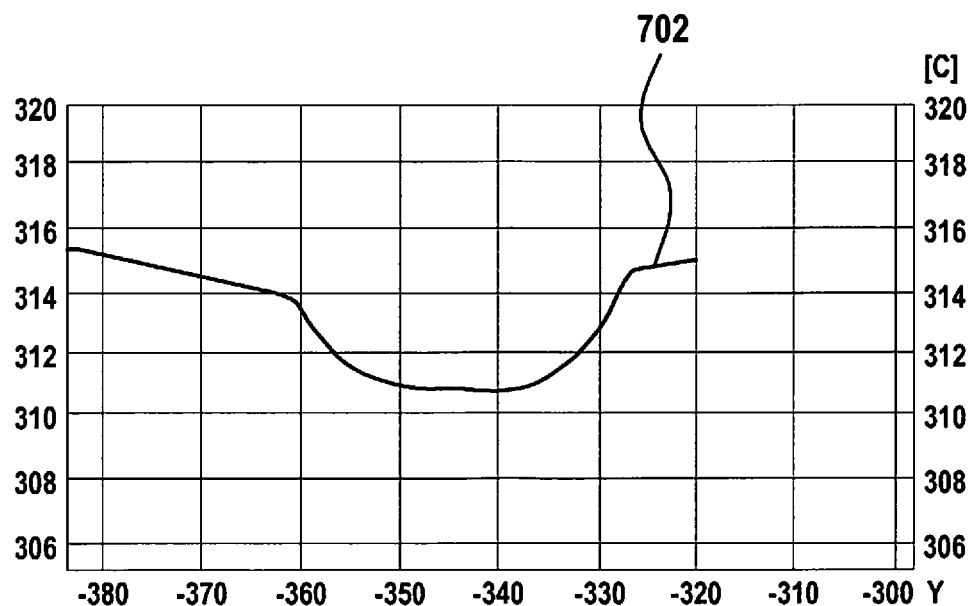
FIG. 11 is the thermal profile in a second sectional plane that is perpendicular to the first sectional plane.

FIG. 10 shows thermal partial profile 701 of the thermal profile from FIG. 9 in a first sectional plane 710, and FIG. 11 shows thermal partial profile 702 of a second sectional plane 720 that is orthogonal to first sectional plane 710.

Figure 12:
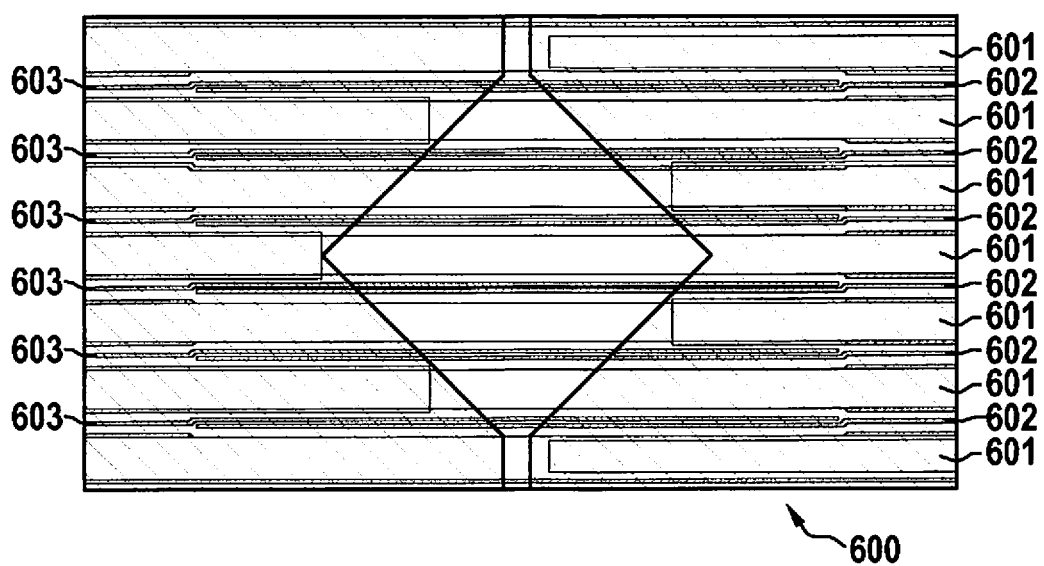
FIG. 12 is a plan view of another metallization level of an FET power transistor in accordance with another exemplary specific embodiment of the present invention.

The simulation first reveals that, in comparison to an unenlarged separation, locally enlarging the separation above the active region results in a modified temperature distribution having moderate, lower maximum temperatures. Moreover, a high local temperature gradient is produced, however, that is consequential for TPMD effects in the subjacent power-distribution metallization layers. To be able to optimally utilize this locally increased RPP stress to detect the degradation of the FET transistor, one or a plurality of detection circuit traces 602, 603 may be used in further metallization level 600 that are narrower in comparison to circuit traces 601 and that may be located underneath the modified metallization structure in the current-distribution metal layers, as shown exemplarily in FIG. 12. They may be drawn in a technology-specific manner with a minimum separation, to act as a predetermined breaking point, so that, in the case of the detection circuit traces, the RPP stress is more likely to lead to a measurable effect than in the case of the remaining actual metallization of the output stage. Thus, upon occurrence of a crack between two detection circuit traces, an increased leakage current is measurable and thus a critical service life point in time is ascertainable. It is also possible to deliberately introduce a notch into the intermetal dielectric in order to locally accelerate the formation of a crack (see illustrations A1 and A2). The detector structure may be further reduced in size with the aid of this supercritical structure. The detection circuit traces may thereby be advantageously routed in such a way that the aging effect caused by TPMD therein occurs reliably before the critical aging limit of the output stage is reached, but not prematurely in a supercritical manner, thus, for example, approximately after 80% to 90% of the useful service life of the output stage. This is attainable, for example, by suitably selecting the length, width, and mutual separation of the detection circuit traces and/or by specifying the typically switched power pulse. An exemplary specific embodiment of the present invention relates to an ASIC that may react in a qualified manner to the TPMD fault event of the detection circuit traces since it includes a drive circuit.

What is claimed is:

1. A power transistor, comprising:
   an active region;
   a metallization level located above the active region for power distribution and for detecting an imminent metallization error induced by RPP stress caused by repeated power pulses; and
   a further metallization level including metal strips located above the metallization level in which galvanically isolated metal elements extend mutually parallel in a direction of extent, of which one pair is used for energizing the power transistor,
   wherein the metal strips each have a cut-out that is disposed above the active region and is located at an edge that faces the respective other metal strip.

2. The power transistor as recited in claim 1, wherein the cut-out is oval, circular, rectangular, rhombic or octagonal.

3. A power transistor, comprising:
   an active region;
   a metallization level located above the active region for power distribution and for detecting an imminent metallization error induced by RPP stress caused by repeated power pulses; and
   a further metallization level located above the metallization level in which galvanically isolated metal elements extend mutually parallel in a direction of extent, of which one pair is used for energizing the power transistor;
   wherein at least one cut-out is formed above the active region in the further metallization level,
   wherein except for at least one stepped feature that extends into the cutout, the cut-out is oval, circular, rectangular, rhombic or octagonal.

4. The power transistor as recited in claim 3, wherein two metal elements of the pair extend mutually parallel in a direction of extent, and the metallization level includes circuit traces of a metal for power distribution extending orthogonally to the direction of extent, a detector circuit trace pair for detecting an imminent metallization error induced by RPP stress being thereby configured between two circuit traces each.

5. The power transistor as recited in claim 4, wherein the detector circuit trace pair is configured underneath the stepped feature.

6. The power transistor as recited in claim 4, wherein at least one detector circuit trace of the detector circuit trace pair has a projection, so that a mutual separation of the detector circuit trace pair is locally reduced.

7. The power transistor as recited in claim 6, wherein an edge of the projection being configured underneath an edge of the cut-out.

8. The power transistor as recited in claim 4, wherein in proportion to the detection circuit traces, the circuit traces being formed to be so wide that stress caused by repeated power pulses is more likely to cause damage to the detection circuit traces than to the circuit traces.

9. A driver having a power transistor, the power transistor comprising:
- an active region;
- a metallization level located above the active region for power distribution and for detecting an imminent metallization error induced by RPP stress caused by repeated power pulses; and
- a further metallization level including metal strips located above the metallization level in which galvanically isolated metal elements extend mutually parallel in a direction of extent, of which one pair is used for energizing the power transistor;
- wherein the metal strips each have a cut-out that is disposed above the active region and is located at an edge that faces the respective other metal strip.

10. An output stage for a vehicle component having a driver, the driver including a power transistor, the power transistor comprising:
- an active region;
- a metallization level located above the active region for power distribution and for detecting an imminent metallization error induced by RPP stress caused by repeated power pulses; and
- a further metallization level including metal strips located above the metallization level in which galvanically isolated metal elements extend mutually parallel in a direction of extent, of which one pair is used for energizing the power transistor;
- wherein the metal strips each have a cut-out that is disposed above the active region and is located at an edge that faces the respective other metal strip, and
- wherein the cut-out is proportional in size to a size of the output stage.

* * * * *